United States Patent
Odagiri et al.

(10) Patent No.: US 9,153,465 B2
(45) Date of Patent: Oct. 6, 2015

(54) SUBSTRATE STAGE, SUBSTRATE PROCESSING APPARATUS AND SUBSTRATE PROCESSING SYSTEM

(75) Inventors: Masaya Odagiri, Nirasaki (JP); Yusuke Muraki, Nirasaki (JP); Jin Fujihara, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 478 days.

(21) Appl. No.: 13/172,317

(22) Filed: Jun. 29, 2011

(65) Prior Publication Data
US 2012/0000612 A1    Jan. 5, 2012

(30) Foreign Application Priority Data
Jun. 30, 2010 (JP) .................... 2010-149652

(51) Int. Cl.
| | |
|---|---|
| *C23C 16/50* | (2006.01) |
| *C23C 16/00* | (2006.01) |
| *C23F 1/00* | (2006.01) |
| *H01L 21/306* | (2006.01) |
| *H01L 21/67* | (2006.01) |
| *C23C 16/40* | (2006.01) |
| *C23C 16/458* | (2006.01) |
| *C23C 16/46* | (2006.01) |
| *H01L 21/687* | (2006.01) |

(52) U.S. Cl.
CPC .......... *H01L 21/6719* (2013.01); *C23C 16/401* (2013.01); *C23C 16/4582* (2013.01); *C23C 16/46* (2013.01); *H01L 21/67109* (2013.01); *H01L 21/68742* (2013.01); *H01L 21/68771* (2013.01); *H01L 21/68785* (2013.01); *Y10T 156/17* (2015.01); *Y10T 156/1702* (2015.01)

(58) Field of Classification Search
USPC ............... 118/728–733; 156/345.51–345.55
See application file for complete search history.

(56) References Cited

U.S. PATENT DOCUMENTS 5,569,350 A * 10/1996 Osada et al. .............. 156/345.51
5,914,568 A     6/1999 Nonaka
(Continued)

FOREIGN PATENT DOCUMENTS

| JP | 1991-113722 A | 7/1993 |
|---|---|---|
| JP | 1993-057840   | 7/1993 |

(Continued)

OTHER PUBLICATIONS

Office Action issued on Apr. 17, 2012 for corresponding JP Application No. 201-149652, with English translation.

*Primary Examiner* — Parviz Hassanzadeh
*Assistant Examiner* — Tiffany Nuckols
(74) *Attorney, Agent, or Firm* — Nath, Goldberg & Meyer; Jerald L. Meyer

(57) ABSTRACT

A substrate stage for mounting a substrate thereon includes a peripheral stage member on which a peripheral substrate portion of the substrate may be mounted, the peripheral substrate portion controlling a temperature of the peripheral substrate portion, a central stage member on which a central substrate portion of the substrate may be mounted, the central substrate portion controlling a temperature of the central substrate portion, and a support base that supports the peripheral stage member and the central stage member. A gap is formed between the peripheral stage member and the central stage member to keep the peripheral stage member and the central stage member from coming in contact with each other.

6 Claims, 4 Drawing Sheets

(56) References Cited

U.S. PATENT DOCUMENTS

| | | | |
|---|---|---|---|
| 6,143,082 A * | 11/2000 | McInerney et al. | 118/719 |
| 6,592,675 B2 * | 7/2003 | Nishikawa | 118/730 |
| 8,741,065 B2 * | 6/2014 | Odagiri et al. | 118/728 |
| 2003/0221624 A1 * | 12/2003 | Jurgensen et al. | 118/725 |
| 2004/0261946 A1 * | 12/2004 | Endoh et al. | 156/345.15 |
| 2005/0051098 A1 | 3/2005 | Aramaki et al. | |
| 2006/0027169 A1 | 2/2006 | Tsukamoto et al. | |
| 2007/0207014 A1 | 9/2007 | Toshima | |
| 2008/0092818 A1 | 4/2008 | Fink et al. | |
| 2009/0255901 A1 * | 10/2009 | Okita et al. | 216/67 |
| 2010/0024981 A1 | 2/2010 | Wallace et al. | |

FOREIGN PATENT DOCUMENTS

| | | |
|---|---|---|
| JP | 9-017770 A | 1/1997 |
| JP | 2003-077779 A | 3/2003 |
| JP | 2006-521017 | 9/2006 |
| JP | 2009-117486 | 5/2009 |
| JP | 3155802 | 11/2009 |

* cited by examiner

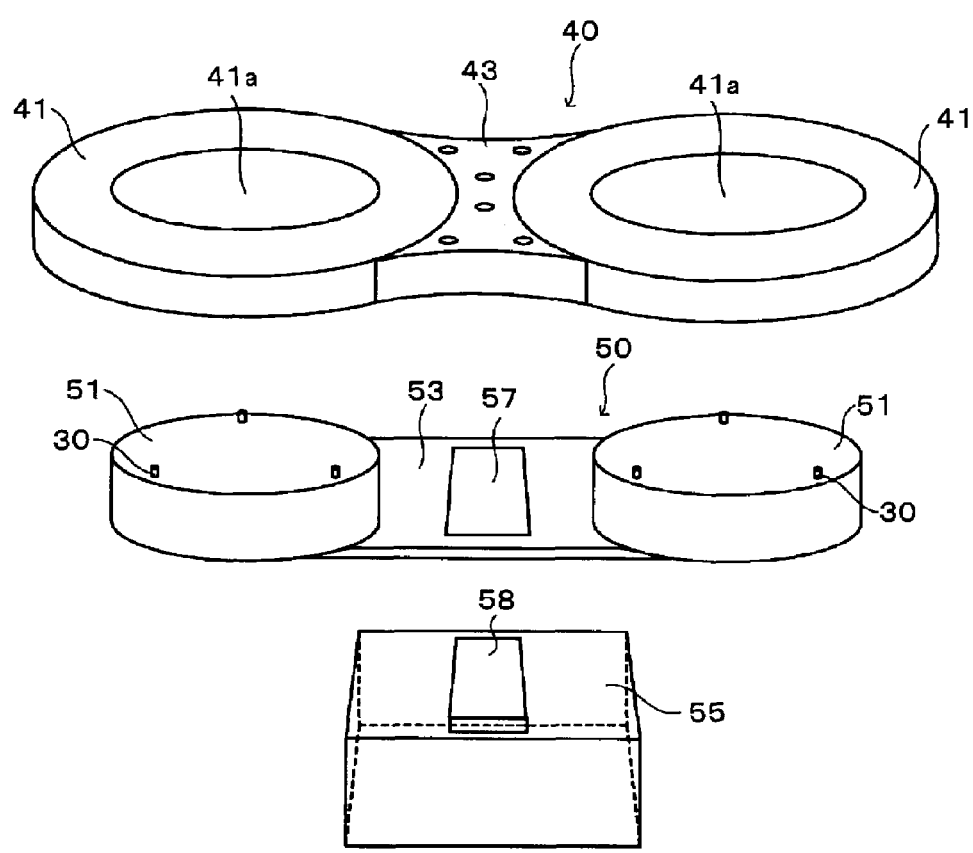

SUBSTRATE STAGE, SUBSTRATE PROCESSING APPARATUS AND SUBSTRATE PROCESSING SYSTEM

CROSS-REFERENCE TO RELATED APPLICATIONS

This application is based upon and claims the benefit of priority from Japanese Patent Application No. 2010-149652, filed on Jun. 30, 2010, the entire contents of which are incorporated herein by reference.

TECHNICAL FIELD

The present disclosure relates to a substrate stage, a substrate processing apparatus and a substrate processing system for use in fine processing of the substrate, e.g., in a semiconductor manufacturing process.

BACKGROUND

When processing a substrate (wafer) in a semiconductor manufacturing process in a vacuum, a temperature control operation for making the surface temperature of the substrate uniform has been performed to enhance processing uniformity. As a substrate temperature control means, a temperature control operation may be performed by forming a coolant flow path within a substrate stage for mounting a substrate. Coolant may be allowed to flow through the flow path thereby cooling the surface of the substrate mounted on the substrate stage with radiant heat radiating from the substrate stage.

For example, JP9-17770A discloses a plasma processing apparatus in which two concentric coolant flow paths are formed within a substrate stage. The temperature of the coolant flowing through the outer flow path differs from that of the coolant flowing through the inner flow path. Thus, the peripheral portion of a substrate exposed to radiant heat radiating from the inner wall of a chamber is cooled more heavily than the central portion of the substrate, thereby attempting to keep the surface temperature of the substrate uniform.

In the plasma processing apparatus disclosed in JP9-17770A, however, the two coolant flow paths, through which coolants differing in temperature flow, are arranged adjacent to each other within one substrate stage. Thus, the temperatures of the two coolant flow paths affect each other, and there is a concern that the cooling operations of the central portion and the peripheral portion of the substrate cannot be independently controlled. In other words, it becomes impossible to precisely manage and control the temperatures of the central portion and the peripheral portion of the substrate mounted on the substrate stage. This makes it difficult to make the surface temperature of the substrate uniform because the surface temperature of the peripheral portion of the substrate is greatly influenced by the radiant heat radiating from the inner wall of a chamber and the surface temperature of the central portion of the substrate is less affected by the radiant heat. Thus, since the entire surface of the substrate is not kept at a uniform temperature when processing the substrate, the substrate cannot be processed uniformly. Moreover, the integral formation of the substrate stage within the plasma processing apparatus is also the reason why the temperatures of the two coolant flow paths have an influence on each other and the temperatures of the central portion and the peripheral portion of the substrate cannot be independently controlled.

SUMMARY

The present disclosure provides some embodiments of a substrate stage, a substrate processing apparatus and a substrate processing system, which are capable of independently and precisely managing and controlling the temperatures of peripheral and central portions of a substrate with no mutual influence of the temperatures from the peripheral and central portions.

According to one aspect of the present disclosure, there is provided a substrate stage on which two or more substrate may be mounted. The substrate stage includes a peripheral stage member on which a peripheral substrate portion of the substrate may be mounted. The peripheral stage member controls a temperature of the peripheral substrate portion. A central stage member is provided on which a central substrate portion of the substrate may be mounted. The central stage member controls a temperature of the central substrate portion. A support base on which the peripheral stage member may be mounted and the central stage member may be mounted is also provided. Further, the peripheral stage member includes two or more peripheral stage portions and a peripheral stage connecting portion that couples the peripheral stage portions, the central stage member includes two or more central stage portions having a shape corresponding to inner circumferences of the peripheral stage portions and a central stage connecting portion that couples the central stage portions, annular gaps are formed between the peripheral stage portions and the central stage portions in a horizontal direction, a gap is formed between the peripheral stage connecting portion and the central stage connecting portion in a vertical direction, and the peripheral stage connecting portion and the central stage connecting portion are coupled to the support base.

Further, temperature control flow paths in communication with a temperature control medium circulating device may be provided within the peripheral stage member and the central stage member.

According to another aspect of the present disclosure, there is provided a substrate processing apparatus for processing a substrate in a vacuum processing space. The processing apparatus includes a processing chamber in which the substrate may be processed; an exhaust port configured to allow an inside of the processing chamber to be vacuumed; a process gas introduction port that allows a process gas to be introduced into the processing chamber; and the aforementioned substrate stage.

Further the processing chamber may include support pins protruding upwards from the substrate stage to vertically movably support the substrate. Projections are formed on a top surface of the substrate stage. The substrate may be mounted on the top surface of the substrate stage by the projections in a substantially contactless relationship with the substrate stage According to a further aspect of the present disclosure, there is provided a substrate processing system including a conveying unit for conveying a substrate, a processing unit for processing the substrate and a heating unit for heating the substrate, the processing unit including: a processing chamber in which the substrate may be processed; an exhaust port configured to allow an inside of the processing chamber to be vacuumed; a process gas introduction port that introduces a process gas into the processing chamber; and the aforementioned substrate stage.

Further the processing chamber may include support pins protruding upwards from the substrate stage to vertically movably support the substrate. Projections are formed on a top surface of the substrate stage, and the substrate is mounted on the top surface of the substrate stage by the projections in a substantially contactless relationship with the substrate stage.

BRIEF DESCRIPTION OF THE DRAWINGS

FIG. 2A is a front perspective view showing a substrate stage, the respective members (a peripheral stage member, a central stage member and a support base) of which are kept in a disassembled state.

DETAILED DESCRIPTION

Figure 1:
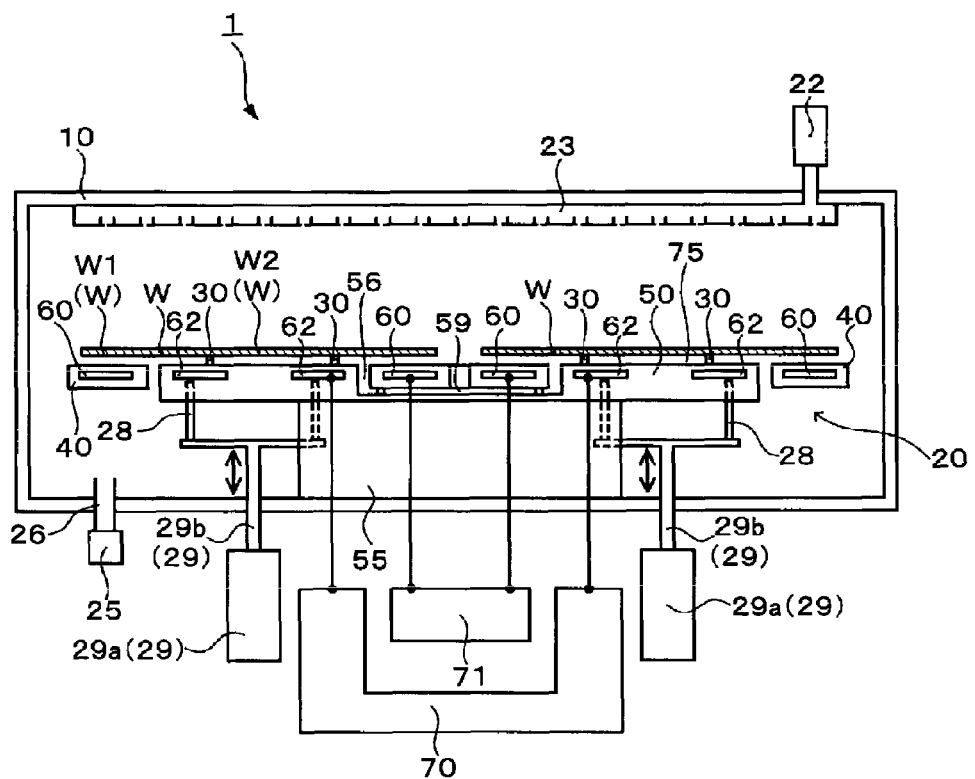
FIG. 1 is a schematic section view showing a substrate processing apparatus.

An embodiment of the present disclosure will now be described with reference to the drawings. In the specification and drawings of the subject application, elements substantially identical in function and configuration will be designated by the same reference numerals and will not be described repeatedly. In the following description, a substrate processing apparatus 1 for simultaneously mounting and processing two substrates W will be taken as one example of the present embodiment.

FIG. 1 is a schematic section view showing a substrate processing apparatus 1 according to one embodiment of the present disclosure. As shown in FIG. 1, the substrate processing apparatus 1 includes a processing chamber 10 and a substrate stage 20 arranged within the processing chamber 10 to mount substrates W thereon when processing the substrates W. Further, FIG. 1 shows two substrates W mounted on the top surface of the substrate stage 20. The processing chamber 10 includes a process gas introduction portion 23 of, e.g., shower shape, in communication with a process gas supply device 22 and an exhaust port 26 in communication with a vacuum pump 25. This makes it possible to vacuum the inside of the processing chamber 10. When processing the substrates W, a process gas is introduced into the processing chamber 10 from the process gas introduction portion 23.

A plurality of support pins 28 penetrating the substrate stage 20 and protruding above the substrate stage 20 to support the substrates W and mount the substrates W onto the substrate stage 20 is provided with the processing chamber 10. The support pins 28 are configured to be lifted up and lowered by a lift device 29 which is connected to the support pins 28 to move the support pins 28 in a vertical direction (in an up-down direction in FIG. 1). As shown in FIG. 1, the lift device 29 includes a drive unit 29a, e.g., an air cylinder, provided outside the processing chamber 10, and a lift unit 29b connected to the drive unit 29a. The lift unit 29b extends from the drive unit 29a in the processing chamber 10. The support pins 28 are attached to the lift unit 29b and are moved up and down together with the lift unit 29b that moves up and down upon actuation of the drive unit 29a. When mounting the substrates W on the top surface of the substrate stage 20, the support pins 28 protrude above the substrate stage 20 by a specified distance. The substrates W are placed on the upper ends of the protruding support pins 28. In this state, the support pins 28 are lowered down so that the tip ends thereof can get closer to the top surface of the substrate stage 20, thereby mounting the substrates W onto the substrate stage 20.

Tiny projections 30 are formed on the top surface of the substrate stage 20. If the support pins 28 supporting the substrates W are lowered down to be adjacent with the top surface of the substrate stage 20 as mentioned above, the substrates W are mounted on the substrate stage 20 so that they are spaced apart from the top surface of the substrate stage 20 by the projections 30 of the top surface of the substrate stage 20 (i.e., in a substantially contactless relationship with the substrate stage 20). In the substrate processing apparatus 1 of the present embodiment, three support pins 28 are provided with respect to one substrate W. Likewise, the projections 30 are formed at three points with respect to one substrate W. The substrates W is lifted up and lowered down in a state that it is supported at three points by the three support pins 28. The substrate W is mounted on the substrate stage 20 in a substantially contactless manner by the projections 30 formed at three points on the top surface of the substrate stage 20 (in a corresponding relationship with each of the substrates W). In this regard, the reason for mounting the substrates W on the top surface of the substrate stage 20 in a substantially contactless manner is that, if the substrates W are directly mounted on the substrate stage 20, impurities such as particles existing on the top surface of the substrate stage 20 may adhere to the surfaces of the substrates W.

Figure 2B:
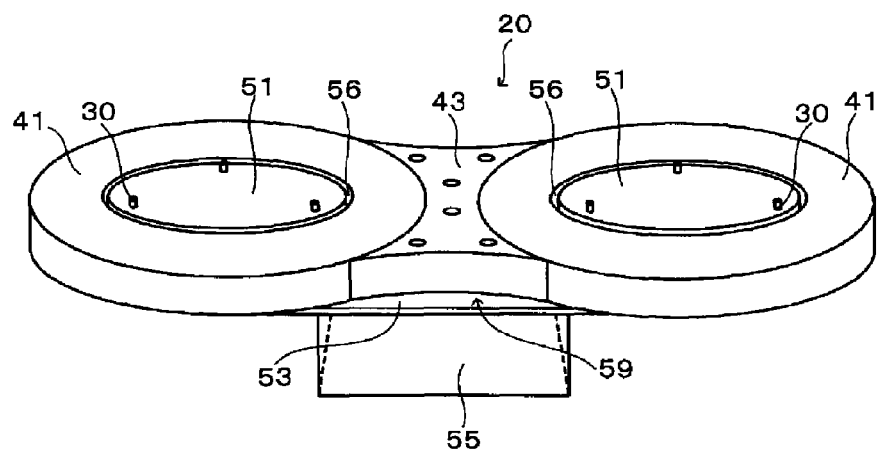
FIG. 2B is a front perspective view showing the substrate stage, the respective members of which are kept in an assembled state.

FIGS. 2A and 2B are explanatory views showing the substrate stage 20. For the sake of description, FIG. 2A shows a front perspective view of the substrate stage 20, the respective members (a peripheral stage member 40, a central stage member 50 and a support base 55) of which are kept in a disassembled state and FIG. 2B shows a front perspective view showing the substrate stage 20, the respective members of which are kept in an assembled state. In this regard, the substrate stage 20 is arranged within the processing chamber 10 of the substrate processing apparatus 1 shown in FIG. 1 so that the respective members are assembled together as shown in FIG. 2B.

As shown in FIGS. 2A and 2B, the substrate stage 20 includes a peripheral stage member 40 for mounting thereon peripheral substrate portions W1, a central stage member 50 for mounting thereon central substrate portions W2 and a support base 55 for supporting the peripheral stage member 40 and the central stage member 50. The peripheral stage member 40 includes two generally-annular peripheral stage portions 41 and a peripheral stage connecting portion 43 for coupling the two peripheral stage portions 41 arranged side by side in the horizontal direction. The central stage member 50 includes two generally-disc-shaped central stage portions 51 and a central stage connecting portion 53 for coupling the two central stage portions 51 arranged side by side in the horizontal direction. In this connection, the shape of the inner circumferences of the peripheral stage portions 41 corresponds to the shape of the central stage portions 51. In other words, the central stage portions 51 fit into the central spaces 41a of the generally-annular peripheral stage portions 41 when the peripheral stage member 40 and the central stage member 50 are superimposed as shown in FIG. 2B. Therefore, the plan-view (top face) shape of the central spaces 41a is substantially the same as the plan-view (top face) shape of the central stage portions 51. The area of the top surface of the central stage portions 51 is smaller than the area of the top surface of the central spaces 41a. The area of the top surface of the peripheral stage portions 41 is substantially equal to the area of the top surface of the central stage portions 51.

Since the shape of the peripheral stage portions 41 corresponds to the shape of the central stage portions 51 as mentioned above, annular gaps 56 are formed between the peripheral stage portions 41 and the central stage portions 51 in the horizontal direction when the peripheral stage member 40 and the central stage member 50 are superimposed as shown in FIG. 2B. A hole portion 57 of, e.g., rectangular shape, is provided in the middle area of the central stage connecting portion 53 as can be seen in FIG. 2A. When the respective members (the peripheral stage member 40, the central stage member 50 and the support base 55) are assembled together to make up the substrate stage 20, the peripheral stage connecting portion 43 and the support base 55 are coupled together by screws (not shown) passing through the hole portion 57. Similarly, the central stage connecting portion 53 and the support base 55 are coupled together by screws (not shown). For coupling purposes, a convex portion 58 having a corresponding shape to the hole portion 57 is provided with the support base 55. In this regard, the coupling of the respective members is performed such that a gap 59 exists between the peripheral stage connecting portion 43 and the central stage connecting portion 53 in a vertical direction. As a result, the substrate stage 20 is made so that the peripheral stage member 40 and the central stage member 50 are kept from coming into contact with each other.

As shown in FIG. 1, temperature control flow paths 60 are formed within the peripheral stage member 40 and temperature control flow paths 62 are formed within the central stage member 50. The temperature control flow paths 60 and 62 are in communication with temperature control medium circulating devices 70 and 71 which contain a coolant such as cooling water. By operating the temperature control medium circulating devices 70 and 71, the coolant can be circulated between the temperature control medium circulating devices 70 and 71 and the temperature control flow paths 60 and 62. The temperature control flow paths 60 communicate with the temperature control medium circulating device 70 and the temperature control flow paths 62 communicate with the temperature control medium circulating device 71. Thus, the operations of the temperature control medium circulating devices 70 and 71 can be independently controlled with respect to the respective temperature control flow paths (the temperature control flow paths 60 and 62). By controlling the temperatures and the flow rates of the coolants flowing through the temperature control flow paths 60 and 62, it is possible to independently control the temperature control effect (cooling effect) on the peripheral substrate portions W1 of the peripheral stage member 40 and the temperature control effect (cooling effect) on the central substrate portions W2 of the central stage member 50. In other words, the cooling operations of the substrates W are performed by the temperature control flow paths 60 and 62 in such a manner that the peripheral substrate portions W1 are cooled by the cooling capacity of the temperature control flow paths 60 formed within the peripheral stage member 40 and the central substrate portions W2 are cooled by the cooling capacity of the temperature control flow paths 62 formed within the central stage member 50. Thus, the peripheral substrate portions W1 and the central substrate portions W2 are cooled by the cooling capacities of different temperature control flow paths.

The substrates W are mounted on the substrate stage 20 in a state that they come into contact with only the tip ends of the projections 30. Gaps 75 are formed between the substrates W and the substrate stage 20 (the peripheral stage member 40 and the central stage member 50). The gaps 75 between the substrates W and the substrate stage 20 are quite narrow relative to the thickness of the substrates W. The temperature control of the substrates W can be performed by allowing the substrates W to exchange heat with the peripheral stage member 40 and the central stage member 50. During the course of substrate processing, the inside of the processing chamber 10 is kept in the process gas. Therefore, the process gas forcibly comes into the gaps 75 formed between the substrates W and the substrate stage 20. This accelerates the heat exchange of the substrates W with the peripheral stage member 40 and the central stage member 50, which makes it possible to efficiently perform the temperature control of the substrates W.

The substrate processing is performed in the substrate processing apparatus 1 including the substrate stage 20 configured as above. The substrate processing performed by the substrate processing apparatus 1 of the present embodiment may include, but is not particularly limited to, e.g., processing $SiO_2$ films formed on the surfaces of the substrates W by using a process gas such as a HF gas, a $NH_3$ gas, and then clean-processing the substrate by removing the $SiO_2$ films from the surfaces of the substrates W through heat treatment. In order to uniformly process substrates in the substrate cleaning process or in other various substrate treatment processes, there is a need to keep the surface temperatures of the substrates W uniform while processing. This necessitates management and control of the surface temperatures of the substrates W. During the course of substrate processing, the substrates W are inputted with the radiant heat radiating from the inner wall of the processing chamber 10 kept higher in temperature than the substrates W. In particular, the amount of heat inputted to the peripheral substrate portions W1 is greater than the amount of heat inputted to the central substrate portions W2 because the distance between the peripheral substrate portions W1 and the inner wall of the processing chamber 10 is shorter than the distance between the central substrate portions W2 and the inner wall of the processing chamber 10. In view of this, the temperatures of the substrates W need to be managed and controlled by the substrate stage 20 in order to keep the surface temperatures of the substrates W uniform.

As mentioned above, the substrate stage 20 of the substrate processing apparatus 1 of the present embodiment includes the peripheral stage member 40 and the central stage member 50. The horizontal gaps 56 and the vertical gap 59 are respectively formed between the peripheral stage member 40 and the central stage member 50. Thus, the peripheral stage member 40 and the central stage member 50 are kept from coming into contact with each other. Since the inside of the processing chamber 10 is vacuumed during the course of substrate processing, the gaps 56 and 59 are vacuum-insulated to prevent mutual influence of the temperatures of the peripheral stage member 40 and the central stage member 50. In other words, the temperature of the temperature control flow paths 60 formed within the peripheral stage member 40 and the temperature of the temperature control flow paths 62 formed within the central stage member 50 do not affect each other. This makes it possible to independently control the temperatures of the peripheral stage member 40 and the central stage member 50.

The temperature of the coolant flowing through the temperature control flow paths 60 formed within the peripheral stage member 40 and the temperature of the coolant flowing through the temperature control flow paths 62 formed within the central stage member 50 are managed and controlled independently of each other, thereby independently and precisely managing and controlling the temperature of the peripheral substrate portions W1 cooled (temperature-controlled) by the temperature control flow paths 60 and the temperature of the central substrate portions W2 cooled (temperature-controlled) by the temperature control flow paths 62. Accordingly, it is possible to precisely make uniform the overall surface temperatures of the substrates W during the course of substrate processing. For example, if the temperature of the peripheral substrate portions W1 grows higher than the temperature of the central substrate portions W2 due to the radiant heat radiating from the inner wall of the processing chamber 10, the temperature of the coolant flowing through the temperature control flow paths 60 is controlled to become lower than the temperature of the coolant flowing through the temperature control flow paths 62. This makes it possible to cool the peripheral substrate portions W1 more heavily than the central substrate portions W2, consequently making the overall surface temperatures of the substrates W uniform.

In the embodiment described above, the coolant flows through the temperature control flow paths 60 and 62 to cool the surfaces of the substrates W by operating the temperature control medium circulating devices 70 and 71. However, in order to precisely control the temperatures of the substrates W, a fluid heated to a specified temperature may be allowed to flow.

Figure 3A:
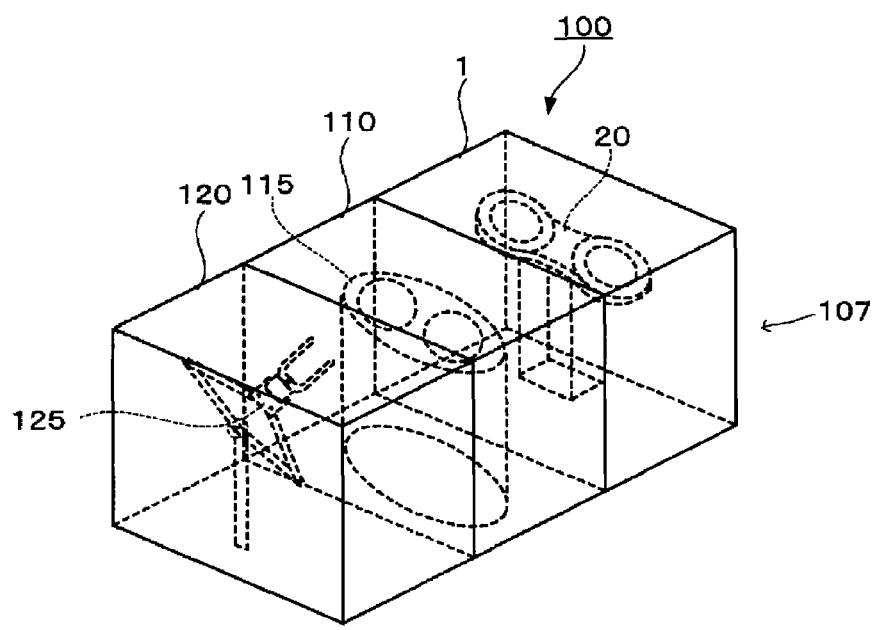
FIG. 3A is a schematic perspective view showing a substrate processing system.
Figure 3B:
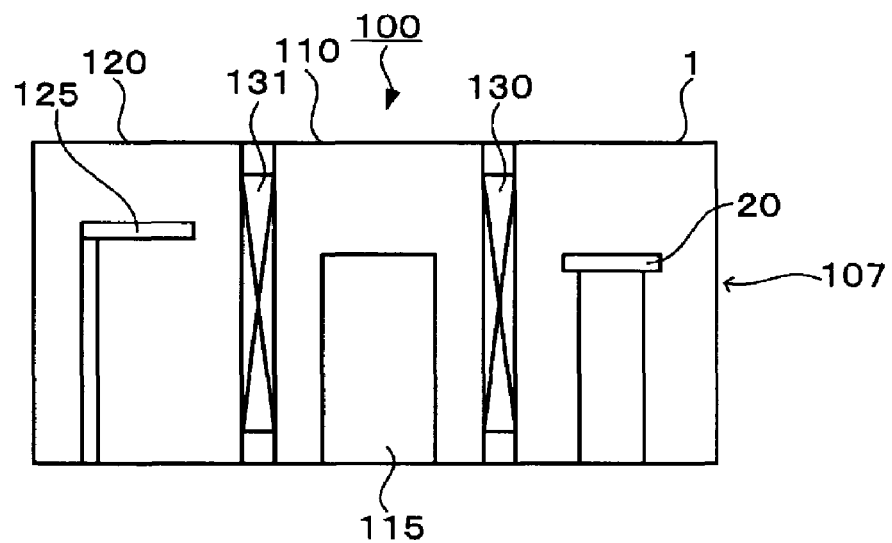
FIG. 3B is a side section view of the substrate processing system.

Next, a substrate processing system 100 including the substrate processing apparatus 1 of the present embodiment will be described in detail. FIGS. 3A and 3B are explanatory views showing the substrate processing system 100. FIG. 3A is a schematic perspective view of the substrate processing system 100. FIG. 3B is a side section view of the substrate processing system 100.

Referring to FIGS. 3A and 3B, the substrate processing system 100 essentially includes a processing unit 107 composed of the substrate processing apparatus 1, a heating unit 110 and a conveying unit 120. In this regard, the substrate processing apparatus 1 is in communication with a coolant storage unit (not shown). The processing unit 107 and the heating unit 110 are arranged adjacent to each other. The heating unit 110 and the conveying unit 120 are arranged adjacent to each other. A gate valve 130 is provided between the substrate processing apparatus 1 and the heating unit 110 and a gate valve 131 is provided between the heating unit 110 and the conveying unit 120. The temperature control medium circulating devices 70 and 71 described above are positioned within the coolant storage unit (not shown). A heating device 115 for heating the substrates W, e.g., a heating plate, is disposed within the heating unit 110. A conveying arm 125 for conveying the substrates W is positioned within the conveying unit 120.

For example, when a cleaning process for removing $SiO_2$ films formed on the surfaces of the substrates W is performed in the substrate processing system 100 configured as shown in FIGS. 3A and 3B, the substrates W are first conveyed from the conveying unit 120 into the substrate processing apparatus 1 by the conveying arm 125 and are mounted on the substrate stage 20 within the substrate processing apparatus 1. When the surface temperatures of the substrates W are kept uniform within the substrate processing apparatus 1, substrate processing is performed by using a process gas such as a HF gas, a $NH_3$ gas. Then, the substrates W processed by the process gas are conveyed to the heating device 115 of the heating unit 110 by the conveying arm 125. Within the heating unit 110, the substrates W are subjected to heat treatment, e.g., heating plate treatment, thereby removing the produced materials on the substrates W by the process gas. Thereafter, the substrates W cleaned through this process are unloaded from the substrate processing system 100 by the conveying arm 125.

In the substrate processing system 100 described above, it is possible to precisely keep the surface temperatures of the substrates W uniform during the course of substrate processing so that substrate processing can be uniformly performed in the substrate processing apparatus 1. Therefore, in the process, e.g., a cleaning process for removing $SiO_2$ films formed on the surfaces of the substrates W, the $SiO_2$ films are uniformly and efficiently processed by the process gas. This makes it possible to uniformly and efficiently remove unnecessary produced materials existing on the substrates W by the heat treatment performed in the heating unit 110. As a result, the entire surfaces of the substrates W are uniformly cleaned in the substrate processing system 100.

While one example of the present embodiment has been described above, the present disclosure is not limited to the illustrated embodiment. It will be apparent to those skilled in the art that various kinds of modifications or changes may be made without departing from the scope of the present disclosure defined in the claims. These modifications or changes shall be construed to fall within the scope of the present disclosure.

For instance, in one example of the present embodiment described above, the horizontal gaps 56 and the vertical gap 59 are formed between the peripheral stage member 40 and the central stage member 50 and are vacuum-insulated within the vacuumed processing chamber 10. Additionally, thermal insulation members made of, e.g., porous ceramics, may be installed in the gaps 56 and 59. This enhances thermal insulation between the peripheral stage member 40 and the central stage member 50 and reduces mutual influence of temperature changes between the peripheral stage member 40 and the central stage member 50. Accordingly, it becomes possible to precisely and independently manage and control the temperature of the coolant flowing through the temperature control flow paths 60 formed within the peripheral stage member 40 and the temperature of the coolant flowing through the temperature control flow paths 62 formed within the central stage member 50.

Further, in some instances radiant heat irradiating from the inner wall of the processing chamber 10 may act more heavily on the peripheral portions of the substrates W (the peripheral substrate portions W1) than on the central portions of the substrates W (the central substrate portions W2), consequently making the surface temperatures of the substrates W non-uniform. In an effort to ameliorate this problem and to reduce heat input from the inner wall of the processing chamber 10 to the substrates W as much as possible, thermal insulation members may be installed on the inner wall of the processing chamber 10. In this case, the thermal insulation members may be installed to cover the entire surface of the inner wall of the processing chamber 10, and in some embodiments may be installed in the area of the inner wall of the processing chamber 10 near the substrates W.

In the substrate processing apparatus 1 of the present embodiment described above, the peripheral stage member 40 and the central stage member 50 are arranged within the processing chamber 10 in a fixed state. Alternatively, each of the peripheral stage member 40 and the central stage member 50 may be arranged in a vertically movable manner. In other words, while the peripheral stage member 40 and the central stage member 50 are coupled to the support base 55 by screws (not shown) in the above-described embodiment, they may be vertically movably supported on the support base 55.

For example, it is conceivable to provide a control unit for independently lifting and lowering the peripheral stage member 40 and the central stage member 50 within the processing chamber 10. One or both of the peripheral stage member 40 and the central stage member 50 is moved up and down with the substrates W mounted thereon, thereby controlling heat exchange of the substrates W with the peripheral stage member 40 or the central stage member 50, and keeping the surface temperatures of the substrates W at an optimal value. By finely adjusting the gaps between the substrates W and the peripheral stage member 40, it is possible to precisely manage and control the surface temperatures of the substrates W and to keep the surfaces of the substrates W in a desired condition (e.g., in a condition of uniform surface temperature).

The present disclosure is applicable to a substrate stage, a substrate processing apparatus and a substrate processing system for use in the field of fine processing a substrate, e.g., in a semiconductor manufacturing process.

According to the present disclosure, it is possible to provide a substrate stage, a substrate processing apparatus and a substrate processing system, which are capable of independently and precisely managing and controlling the temperatures of peripheral and central portions of a substrate with no mutual influence of the temperatures from the peripheral and central portions.

While certain embodiments have been described, these embodiments have been presented by way of example only, and are not intended to limit the scope of the disclosures. Indeed, the novel apparatuses and systems described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate stage for mounting two or more substrates thereon, the substrate stage comprising:
    a peripheral stage member on which a peripheral substrate portion of the substrate is mounted, the peripheral stage member controlling a temperature of the peripheral substrate portion;
    a central stage member on which a central substrate portion of the substrate is mounted, the central stage member controlling a temperature of the central substrate portion; and
    a support base that supports the peripheral stage member and the central stage member,
    wherein the peripheral stage member includes two or more annular peripheral stage portions and a peripheral stage connecting portion that couples the peripheral stage portions arranged side by side in a horizontal direction, the central stage member includes two or more disc-shaped central stage portions having a shape corresponding to inner circumferences of the peripheral stage portions and a central stage connecting portion that couples the central stage portions arranged side by side in the horizontal direction, annular gaps are formed between the peripheral stage portions and the central stage portions in the horizontal direction, a gap is formed between the peripheral stage connecting portion and the central stage connecting portion in a vertical direction, and the peripheral stage connecting portion and the central stage connecting portion are coupled to the support base while keeping the peripheral stage portions and the central stage portions from coming into contact with each other, and
    wherein each of the peripheral stage portions has a top surface on which the peripheral substrate portion is mounted, and is fixed to the peripheral stage connecting portion.

2. The substrate stage of claim 1, wherein temperature control flow paths in communication with a temperature control medium circulating device are provided within the peripheral stage member and the central stage member.

3. A substrate processing apparatus for processing a substrate in a vacuum processing space, the substrate processing apparatus comprising:
    a processing chamber in which the substrate is processed;
    an exhaust port configured to allow an inside of the processing chamber to be vacuumed;
    a process gas introduction port through which a process gas is introduced into the processing chamber; and
    the substrate stage of claim 1.

4. The apparatus of claim 3, wherein the processing chamber includes support pins protruding upwards from the substrate stage to vertically movably support the substrate, projections are formed on a top surface of the substrate stage, and the substrate is mounted on the top surface of the substrate stage by the projections in a substantially contactless relationship with the substrate stage.

5. A substrate processing system comprising a conveying unit for conveying a substrate, a processing unit for processing the substrate and a heating unit for heating the substrate, the processing unit including:
    a processing chamber in which the substrate is processed;
    an exhaust port configured to allow an inside of the processing chamber to be vacuumed;
    a process gas introduction port that allows a process gas to be introduced into the processing chamber; and
    the substrate stage of claim 1.

6. The system of claim 5, wherein the processing chamber includes support pins protruding upwards from the substrate stage to vertically movably support the substrate, projections are formed on a top surface of the substrate stage, and the substrate is mounted on the top surface of the substrate stage by the projections in a substantially contactless relationship with the substrate stage.

* * * * *